United States Patent [19]
Fritz

[11] Patent Number: 5,757,070
[45] Date of Patent: May 26, 1998

[54] INTEGRATED CIRCUIT PACKAGE

[75] Inventor: Donald S. Fritz, San Jose, Calif.

[73] Assignee: Altera Corporation, San Jose, Calif.

[21] Appl. No.: 547,426

[22] Filed: Oct. 24, 1995

[51] Int. Cl.⁶ .................................. H01L 23/495
[52] U.S. Cl. ................ 257/675; 257/676; 257/723; 257/796
[58] Field of Search ........................ 257/666, 723, 257/691, 676, 675, 787, 796

[56] References Cited

U.S. PATENT DOCUMENTS

| | | | |
|---|---|---|---|
| 5,196,725 | 3/1993 | Mita et al. | 257/691 |
| 5,365,409 | 11/1994 | Kwon et al. | 257/666 |
| 5,455,453 | 10/1995 | Harada et al. | 257/675 |
| 5,633,529 | 5/1997 | Otsuki | 257/691 |

FOREIGN PATENT DOCUMENTS

WO93/17455  9/1993  WIPO.

OTHER PUBLICATIONS

Amkor Electronics, Inc. "PowerQuad1¹⁹⁸ Data Sheet," May 1993.
Amkor Electronics, Inc. "PowerQuad2¹⁹⁸ Data Sheet," May 1993.
Shinko Electric Industries Co., Ltd., "HyperQuad Series—Type 2, Die Pad Heat Spreader QFP," Jun. 1994.
Shinko Electric Industries Co., Ltd., "HyperQuad Series—Type 2, Three Metal Layer QFP," Jun. 1994.
Worltek International Limited, "ASAT® EdQuad Construction," undated.
Worltek International Limited, "ASAT® Ed Quad Cross Section," undated.

*Primary Examiner*—Tom Thomas
*Assistant Examiner*—Roy Potter
*Attorney, Agent, or Firm*—Fish & Neave; Jeffrey H. Ingerman

[57] ABSTRACT

An integrated circuit package in which the lead fingers are spaced away from the heat slug is provided. This allows the area of the heat slug to be used for a metallized contact area to serve as a power plane, ground plane, signal bus or the like. The metallized area is preferably insulated from the slug by a ceramic layer. The ceramic layer is preferably adhered to the slug by a nonconductive adhesive, and the metallized layer is preferably a sheet of metal that is preferably adhered to the ceramic layer by a preferably nonconductive adhesive. Nonconductive adhesive can also be used in place of the ceramic layer as an insulating layer. The package preferably also includes an interposer in the windowframe formed around the die by the ceramic layer, with the interposer adhered to the slug by a preferably nonconductive adhesive. More than one interposer, and more than one metallized layer or area, may also be provided.

57 Claims, 6 Drawing Sheets

INTEGRATED CIRCUIT PACKAGE

BACKGROUND OF THE INVENTION

This invention relates to packages for integrated circuits. More particularly, this invention relates to an integrated circuit package having a conductive plane for intermediate bonding of input/output leads.

Most power integrated circuit packages share a substantially standard construction. Specifically, the actual circuitry is on a semiconductor die, which is mounted, usually by adhesive, to a relatively large (as compared to the die) mass or "slug" which acts as a heat sink. Frequently, this heat sinking mass is made of copper.

The die has a plurality of terminal pads through which power, ground and signals are communicated outside the die. A respective small wire lead is bonded, by a process known as "wirebonding," to each terminal pad. The other end of each of the wire leads is wirebonded to one of a plurality of metallic lead fingers, which lay on the heat sinking mass but are separated from it by a nonconductive layer. Frequently, this nonconductive layer is simply an insulating adhesive tape, although it may be other materials such as a ceramic layer bonded to the heat sinking mass.

The lead fingers are generally formed, as by stamping, from a single sheet of a suitable conductive metal, which preferably is copper or a copper alloy, plated with gold or silver to improve wire bondability. The portions which are to protrude from the package as pins are joined together by a rectangular band of metal at their outer extremities, forming a unit known as a leadframe. To assemble the power integrated circuit package, the insulating layer is applied to the heat sinking mass, and the leadframe is attached in place. The die is subsequently affixed, and the wire leads are wirebonded to the appropriate pads and fingers.

The entire assembly is encased in a plastic or epoxy "mold compound," with ends of the lead fingers protruding as pins for connection to outside devices. The band of metal is cut off from the fingers, which are then bent, if necessary, into their desired configuration.

As integrated circuit devices become more complex, the number of outside pins provided, or the functions assigned to those pins, tend to increase. However, frequently, it is desirable that a more complex member of an existing family of devices have some pins in common with the existing family members. For example, in a particular family of programmable logic devices, it may be desirable to have power, ground and clock signals, as well as other signals, appear on the same pins in all members of the family. However, as the devices become more complex, the locations of the actual input/output pads on the die may change, because those locations are at least partially dictated by the internal circuit paths within the die. Therefore, in order to maintain compatible pin assignments, it may be necessary for the wire leads within the package to cross. But such crossing of the leads is disfavored, because it may lead to short circuits.

In one previously known solution to the problem of maintaining compatible pin assignments, a metallized ring is provided outside and spaced from the perimeter of the die, with a connection to a lead finger and thence outside the device. The metallic or metallized ring, which is sometimes known as an "interposer," is usually mounted on the surface of the heat sinking mass, adjacent the die, with a nonconductive adhesive or tape. Most commonly, the interposer, when provided, is part of the leadframe.

An interposer is generally used to provide ground or power to the die, allowing the ground or power pin on the exterior of the package to be at any desired location, regardless of the location on the die of the ground or power pad. However, the compatibility referred to above may require that more than one pin be in a standard location.

Therefore, in another previously known alternative, ground and power planes, insulated from each other, from the die, and from the heat sinking mass, are provided. However, such planes are very close together, separated only by the thickness of a layer of adhesive or adhesive tape. The plane of the lead fingers also is very close to the ground and power planes as discussed above. The proximity of these three planes to each other gives rise to relatively high capacitances and inductances, which may affect device performance. In addition, significant open area between the die and the lead fingers is required for access to the ground and power planes, so that a relatively smaller fraction of the total device area is available for the die. Put another way, while package area must exceed die area, the use of ground and power planes as described increases the excess of package size over die size.

Finally, the use of adhesive tape and similar insulators to separate the various layers makes previously known packages particularly susceptible to delamination in the presence of moisture, as a result of which moisture enters between the layers of the package. Such moisture has been known to give rise to a "popcorn" effect, in which moisture that has penetrated the package expands when the package is subjected to heat—either during assembly to a circuit board or as a result of operation of the circuit—causing the package to delaminate at the internal surfaces, or to rupture.

It would be desirable to be able to provide an integrated circuit package having increased flexibility to maintain compatible assignments among members of a family of integrated circuit devices.

It would also be desirable to be able to provide an integrated circuit package in which as much of the package area as possible is occupied by the integrated circuit die.

It would further be desirable to be able to provide an integrated circuit package in which capacitance and inductance among the various power and signal paths are minimized.

It would still further be desirable to be able to provide an integrated circuit package in which the lead fingers were better insulated from the heat sinking mass.

It would yet further be desirable to be able to provide an integrated circuit package that is resistant to moisture-induced delamination.

SUMMARY OF THE INVENTION

It is an object of this invention to provide an integrated circuit package having increased flexibility to maintain compatible assignments among members of a family of integrated circuit devices.

It is also an object of this invention to provide an integrated circuit package in which as much of the package area as possible is occupied by the integrated circuit die.

It is a further object of this invention to provide an integrated circuit package in which capacitance and inductance among the various power and signal paths are minimized.

It is a still further object of this invention to provide an integrated circuit package in which the lead fingers were better insulated from the heat sinking mass.

It is yet a further object of this invention to provide an integrated circuit package that is resistant to moisture-induced delamination.

In accordance with this invention there is provided an integrated circuit package, comprising a heat sinking mass having a plurality of edges and a first surface. At least a portion of the first surface is nonconductive. An integrated circuit die is mounted on the first surface. The integrated circuit die has a plurality of terminal pads. A plurality of lead fingers positioned substantially in a leadframe plane spaced away from the first surface. A conductive layer is bonded to at least a portion of the nonconductive portion of the first surface. There are a plurality of lead wires, at least one of the lead wires being connected between one of the terminal pads and one of the lead fingers, at least one of the lead wires is connected between one of the terminal pads and the conductive layer, and at least one of the lead wires is connected between the conductive layer and one of the lead fingers.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
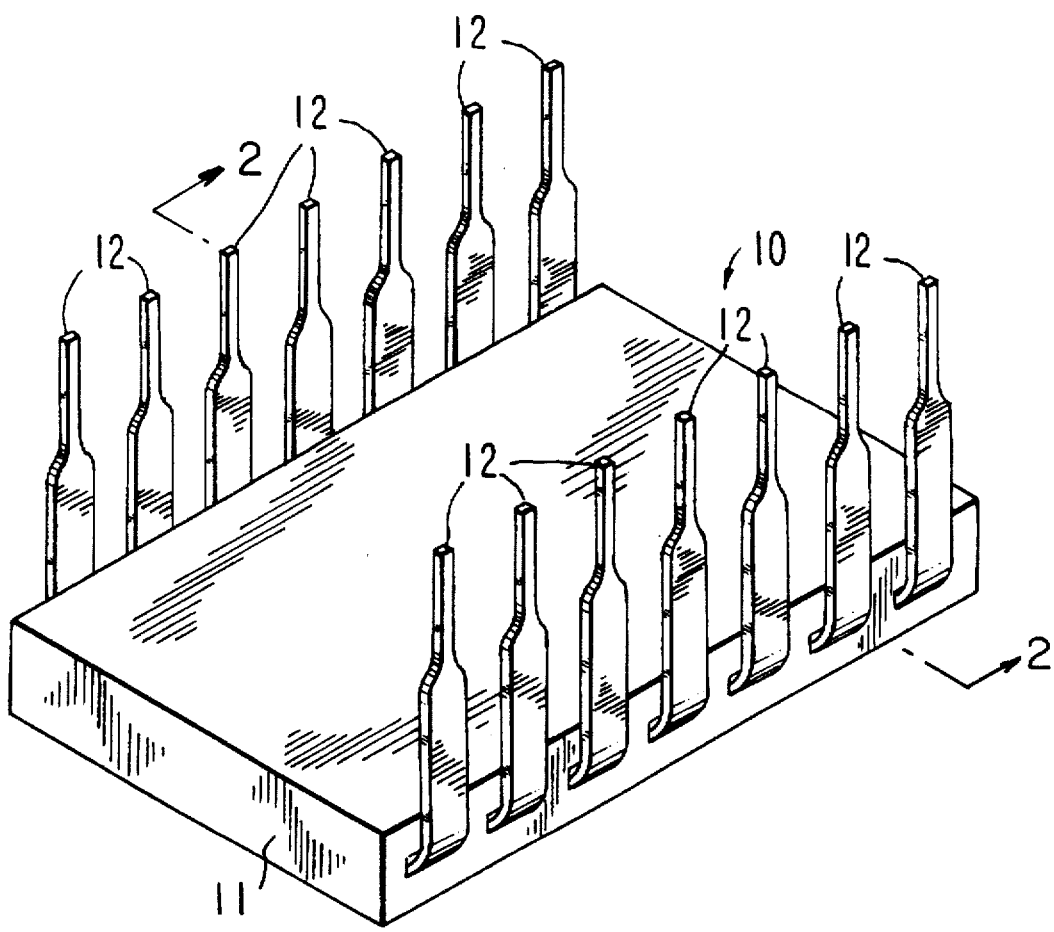
FIG. 1 is a perspective view of the exterior of a first preferred embodiment of an integrated circuit package according to the present invention.

The present invention makes a number of improvements to integrated circuit packages that increase their reliability and performance while increasing flexibility in connecting particular output pads to particular output pins (via the lead fingers).

First, to improve the insulation of the lead fingers from the heat sinking mass, which is usually a conductive copper slug, the use of adhesive tape as the insulating layer is preferably avoided. Instead, a nonconductive ceramic layer is preferably applied to the surface of the slug, leaving a central window in which the die is adhered to the slug. The ceramic layer preferably may be affixed to the slug by a suitable adhesive, which is preferably, but not necessarily, nonconductive. As described below, nonconductive adhesive may also serve as the insulating layer in place of the ceramic layer.

Second, the integrated circuit package preferably has at least one interposer, of the type described above, preferably affixed to the heat slug within the window in the ceramic layer. The interposer preferably is adhered to the heat slug, which is usually conductive, by a nonconductive adhesive, although for the interposer's preferred use as a ground plane, the adhesive need not necessarily be nonconductive (in situations in which it is acceptable for the entire heat slug to be part of the ground plane).

Because of the thickness of the insulating layer, the surface of the heat slug to which the interposer is affixed is in a significantly different plane from the upper surface of the insulating layer on which the lead fingers might rest. This requires a downset in the leadframe portions, or "paddles," connected to the interposer. Once such a downset is required, it need not be limited to the thickness of the ceramic layer.

Thus, according to a third aspect of the present invention, a larger downset is provided, so that the lead fingers are spaced away from the surface of the insulating layer. This improves the electrical properties of the integrated circuit package, as the separation of the signal paths on the lead fingers from the ground plane decreases capacitance and inductance. The contact of the interposer with the heat slug provides the necessary registration of the leadframe with the slug for proper alignment and assembly of the integrated circuit package, particularly when the interposer is adhered to the heat slug.

Once the lead fingers have been spaced away from the insulating layer, that leaves room for a fourth aspect of the present invention, which is the provision of a conductive metal surface which can be used as a power plane (or as a ground plane if the interposer is used for power or signals), increasing the flexibility of pad and pin assignments. Depending on the type of circuit involved, it may even be possible to use the conductive surface as a type of signal bus if there are a plurality of inputs/outputs on the die that are meant to share a bus.

The conductive metal surface can be provided as a thin- or thick-film metallization. More preferably, however, in order to minimize cost, the conductive metal surface is provided by bonding a thin metal sheet to the ceramic surface, preferably using a nonconductive adhesive. Most preferably, to reduce costs further, the ceramic layer can be omitted, and the metal sheet can be bonded directly to the heat slug using a nonconductive adhesive (which also serves as the insulating layer). The metal sheet is preferably made of the same metal as the leadframe—i.e., copper or a copper alloy, preferably plated with a second metal, such as gold or silver, to improve wire bondability.

The surface of the metallization film or metallic sheet used for the conductive layer can also be selected for maximum compatibility with the mold compound, to reduce delamination and infiltration by moisture as discussed above. Infiltration by moisture is also reduced by using the ceramic layer, or the metal sheet with the nonconductive adhesive, instead of an adhesive tape.

The present invention is intended for use primarily with power integrated circuits, which are the type that normally have heat sinking masses. However, the invention is applicable to any integrated circuit package that includes, for whatever reason, a heat sinking mass.

A first preferred embodiment of the present invention is shown in FIGS. 1-4, FIG. 3 being schematic and showing only a representative subset of the lead fingers of integrated circuit package 10. Integrated circuit package 10 is conventional in its exterior configuration. As shown in FIG. 1, integrated circuit package 10 is a standard 4-pin dual-inline package (DIP), having a plastic body 11 and fourteen contact pins 12. Plastic body 11 is made from a suitable epoxy or mold compound, while pins 12, as extensions of the lead fingers described above, preferably are made from copper, or a copper alloy, plated with a suitable solder alloy, such as lead (Pb) tin (Sn) alloy. Although integrated circuit package 10 as shown in FIG. 1 is a DIP, it may in fact be any type of integrated circuit package, such as a package intended for surface mounting (which would have a different type of pin 12).

Figure 2:
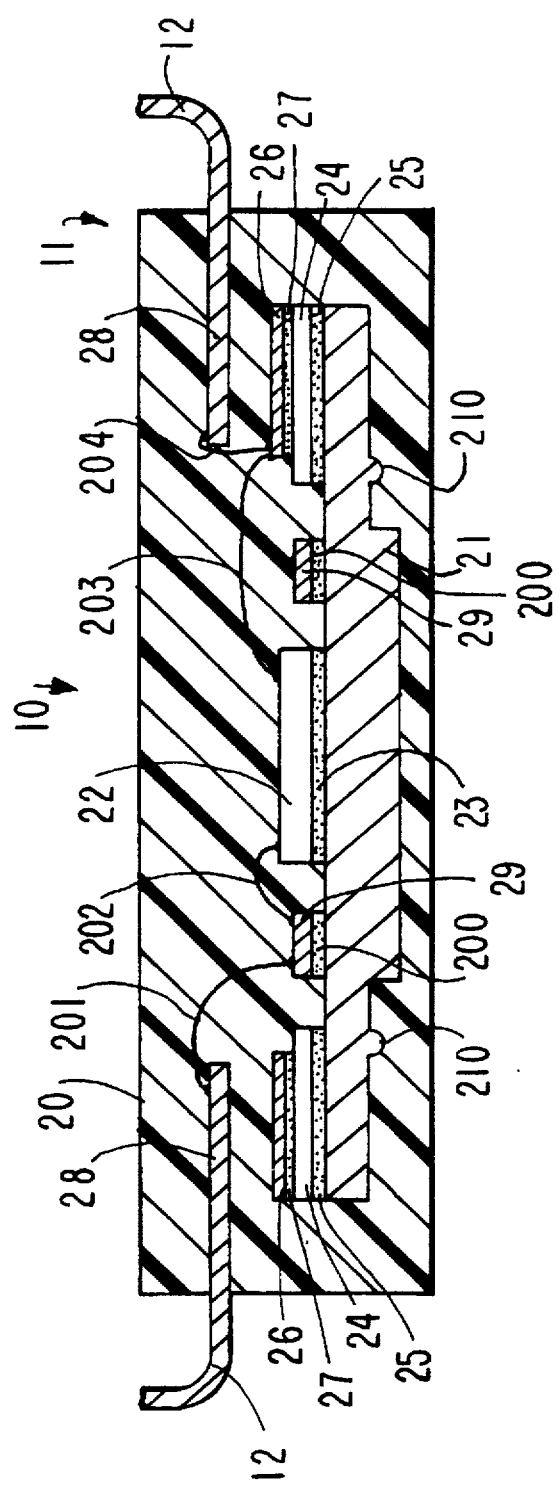
FIG. 2 is a cross-sectional view of the preferred embodiment of the integrated circuit package of FIG. 1, taken from line 2—2 of FIG. 1.
Figure 3:
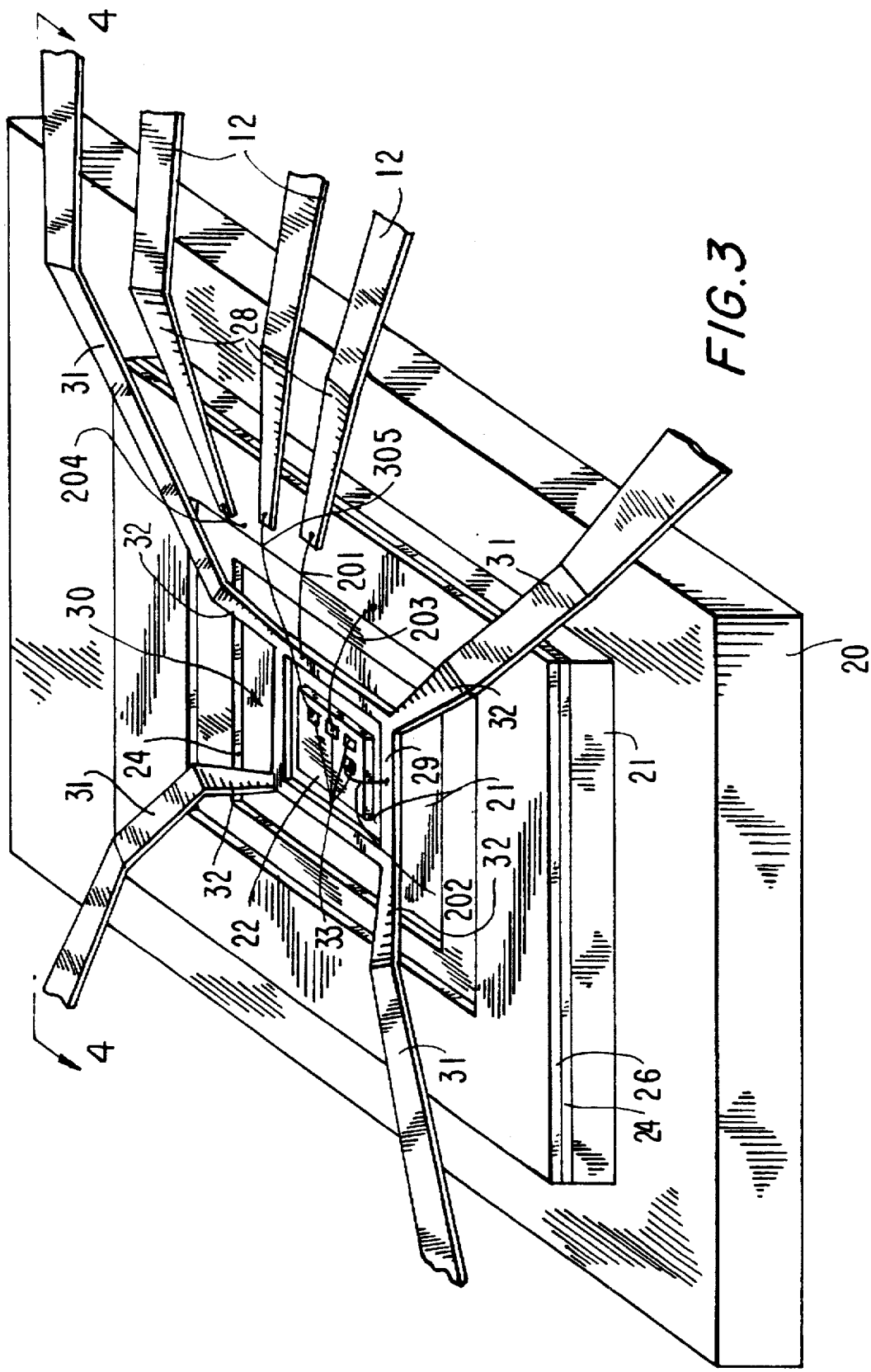
FIG. 3 is a fragmentary perspective view of the preferred embodiment of the integrated circuit package of FIGS. 1 and 2, showing the interior construction.

As shown in FIGS. 2 and 3, the interior of integrated circuit package 10 preferably is fully encapsulated in mold compound 20, although FIG. 3 shows mold compound 20 cut away to reveal heat sinking mass or slug 21, preferably made of copper. Slug 21 may have keys 210 for interlocking with mold compound 20. Integrated circuit die 22 is mounted to slug 21 by adhesive 23, which preferably is nonconductive. An example of a suitable nonconductive adhesive is cyanate ester polymer.

Ceramic layer 24, which preferably is made from a nonconducting ceramic material such as alumina, covers most of the face of slug 21, except in the center at windowframe 30, which surrounds die 22. Ceramic layer 24 may be bonded to slug 21 in any suitable way, preferably by nonconductive adhesive 25, which may be the same as nonconductive adhesive 23.

Metallized layer 26 is bonded to the surface of ceramic layer 24. As stated above, layer 26 may be a thin-or thick-film metallization, but preferably is a metallic sheet adhered to ceramic layer 24 or directly to slug 21 by an adhesive 27, which preferably is nonconductive (particularly if ceramic layer 24 is omitted) and may be the same as adhesives 23, 25. As also stated above, if metallized layer 26 is a metallic sheet, as is preferred, it is preferably made of copper or a copper alloy, and is plated with silver or gold to improve wire bondability. As shown, layer 26 covers only a portion of the surface of ceramic layer 24; however, it may cover the entire surface.

Lead fingers 28, which are the extensions of pins 12, are spaced apart from metallized layer 26, with the space between them preferably filled with mold compound 20.

Interposer 29 is attached to the surface of slug 21 within windowframe 30, surrounding die 22, by adhesive 200, which preferably is nonconductive and may be the same as adhesive 23, 25, 27. As stated above, interposer 29 may be used as a power plane or ground plane, and it may even be used as a signal bus. In previously known packages, the slug 21 itself was used as the ground plane. In the preferred embodiment of the present invention, even if interposer 29 is to be used as the ground plane, it is preferably insulated from slug 21 by nonconductive adhesive 200, because that isolates slug 21 from the ground plane and substantially eliminates or reduces capacitive and inductive contributions from slug 21.

As stated above, interposer 29 preferably is formed as part of the same leadframe from which lead fingers 28 are formed. Paddles 31, which are attached to the corners of interposer 29, are therefore in the same leadframe plane as lead fingers 28, but each paddle 31 also has a downset portion 32, which extends downward into windowframe 30 to connect to interposer 29. As shown in FIG. 3, each paddle 31 extends outside mold compound 20. However, in practice, paddles 31 preferably would be cut off (not shown) within mold compound 20.

FIGS. 2 and 3 show a representative assortment of wirebonds in integrated circuit package 10. Lead wire 201 is wirebonded to interposer 29 and a lead finger 28. Lead wire 202 is wirebonded to interposer 29 and a terminal pad 33 on die 22. Lead wire 203 is wirebonded to metallized layer 26 and a terminal pad 33 on die 22. Lead wire 204 is wirebonded to metallized layer 26 and a lead finger 28. Lead wire 305 (FIG. 3 only) is wirebonded to a terminal pad 33 and a lead finger 28.

Figure 4:
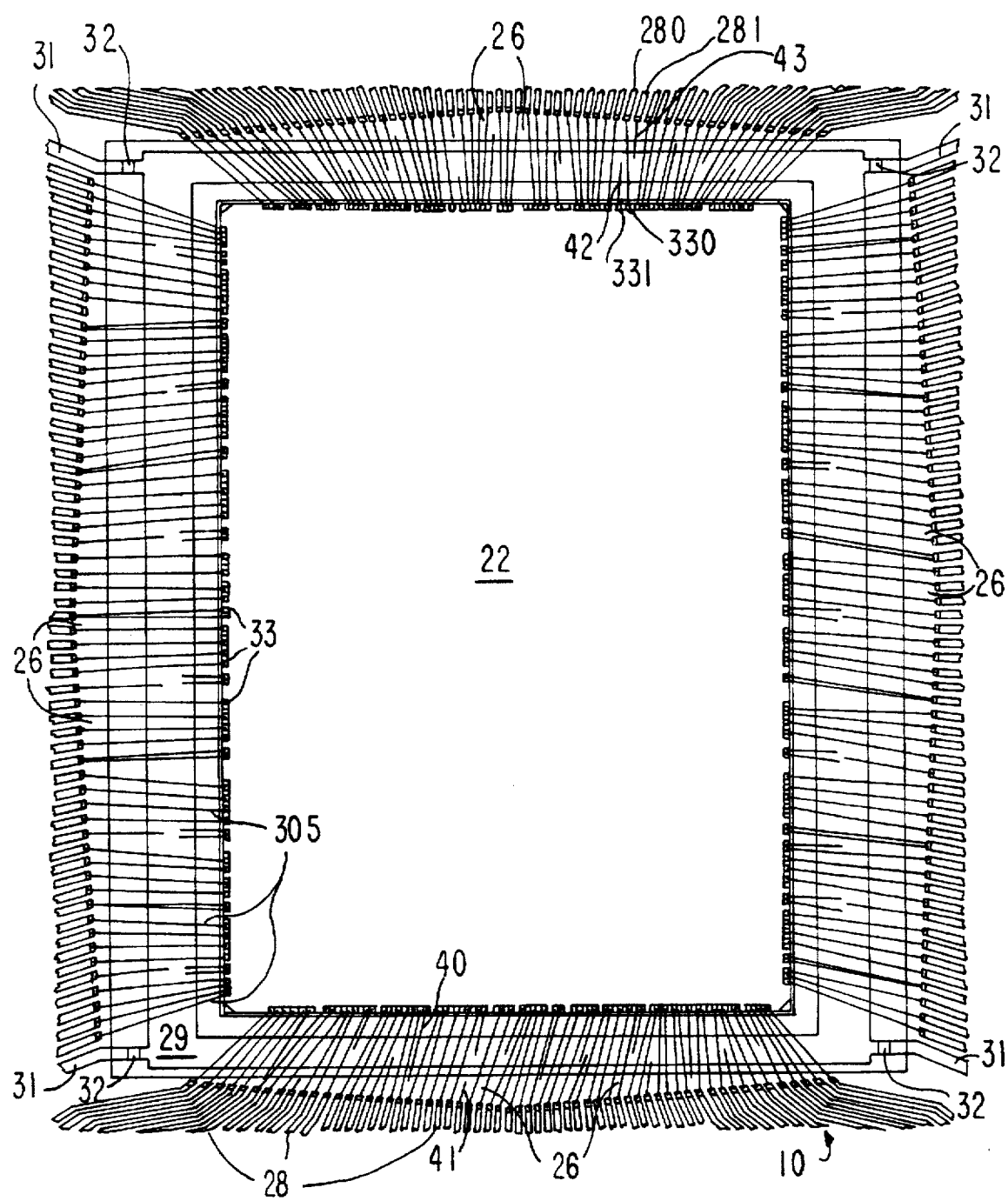
FIG. 4 is a plan view of the interior of the preferred embodiment of the integrated circuit of FIGS. 1-3, taken from line 4—4 of FIG. 3.

FIG. 4 shows a plan view of a fully populated set of wirebonded leads as might be used in actual device. The majority of leads are the same type as lead 305, extending from a pad 33 to a lead finger 28. Lead 40 is one of several examples of a connection from a pad 33 to metallized layer 26, while lead 41 connects a lead finger 28 to metallized layer 26. Assuming that metallized layer 26 is the power plane of package 10, and that the device packaged in package 10 is part of a family of devices, lead 41 would be useful where the pin 12 associated with that particular lead finger 28 is, in the family of devices, always the power pin, but the layout of circuits on die 22 does not allow for a power input in that location.

Leads 42, 43 show another utility of the present invention, demonstrating the situation where the pins 12 associated-with lead fingers 280, 281 are used for signals on pads 330, 331 respectively, and the leads would have to cross each other. Again, this is a situation that most likely would arise when the external pin assignments are dictated by a compatibility requirement of a family of devices. Rather than have the leads cross, the connection from lead finger 281 to pad 331 is broken into two leads 42, 43, which extend from pad 331 and finger 281, respectively, to interposer 29. In this case, interposer 29 presumably is being used as a ground plane, and can have no other uses (other connections to interposer 29 are shown nevertheless, to illustrate the various possible configurations).

Figure 5:
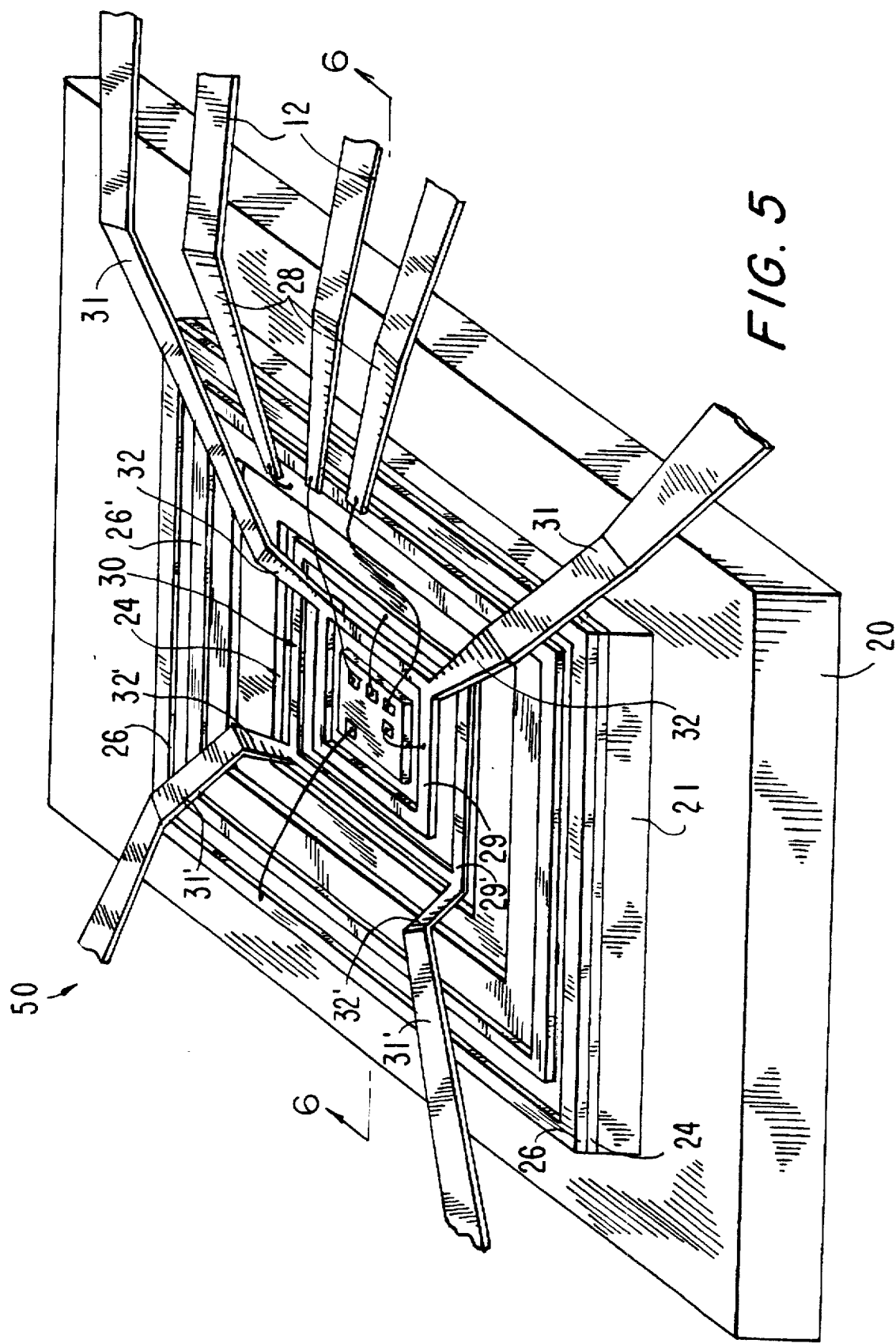
FIG. 5 is a fragmentary perspective view, similar to FIG. 3, of a second preferred embodiment of an integrated circuit package according to this invention.
Figure 6:
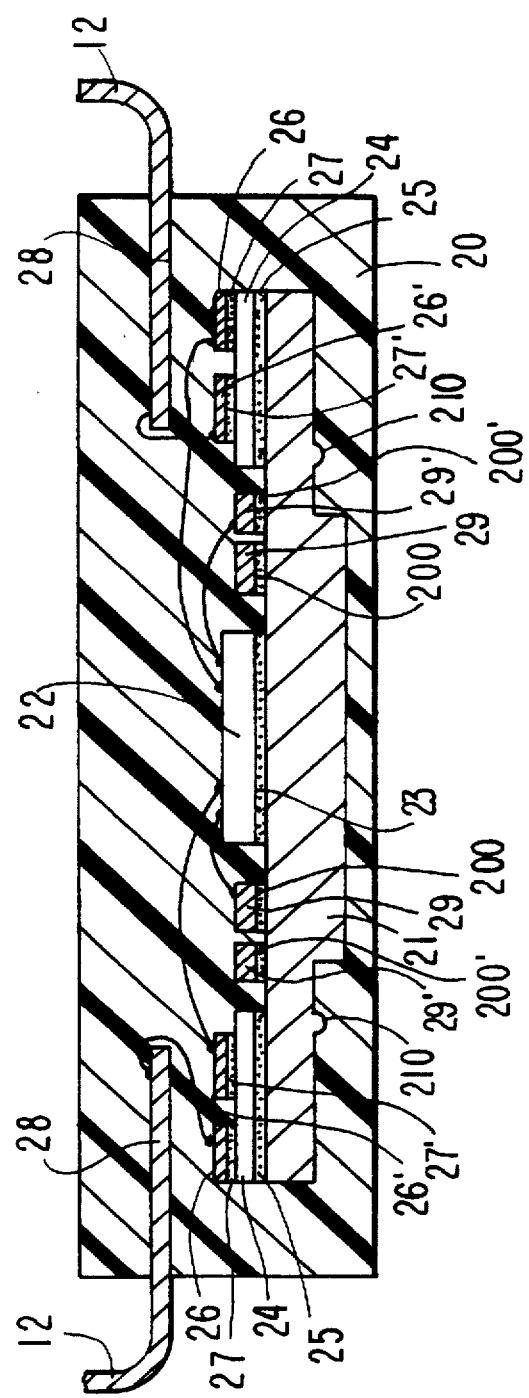
FIG. 6 is a cross-sectional view of the second preferred embodiment of the integrated circuit package of FIG. 5, taken from line 6—6 of FIG. 5.

As stated above, the integrated circuit package according to the present invention may have more than one interposer, or more than one conductive area on the ceramic layer 24. A second preferred embodiment 50, having two interposers and two conductive areas, is shown in FIGS. 5 and 6.

Integrated circuit package 50 is preferably similar to integrated circuit package 10, preferably having mold compound 20 encapsulating slug 21 on which is mounted die 22. Ceramic layer 24 is preferably adhered by preferably nonconductive adhesive layer 25 to the surface of slug 21. A first metallized layer 26 is affixed to the surface of ceramic layer 24, preferably adjacent the outer edge or ceramic layer 24. As in the first preferred embodiment, metallized layer 26 can be a metallization film, or more preferably a sheet of metal as above, preferably attached by a preferably nonconductive adhesive 27. A second metallized layer 26', preferably substantially identical to layer 26, is also provided in this embodiment, preferably inboard of layer 26 and outboard of windowframe 30, and preferably attached by preferably nonconductive adhesive 27'.

Integrated circuit package 50 preferably also includes a first interposer 29, affixed to the surface of slug 21 within windowframe 30, adjacent to die 22. As in the first preferred embodiment, interposer 29 is preferably formed as part of the leadframe and preferably is adhered to slug 21 by a preferably nonconductive adhesive 200. In addition, this embodiment also includes a second interposer 29', preferably between the first interposer 29 and the edge of windowframe 30, preferably adhered to the surface of slug 21 by preferably nonconductive adhesive 200'. For ease of alignment and assembly, second interposer 29' preferably is also formed from the same leadframe as lead fingers 28 and first interposer 29. To do so, second interposer 29' would preferably be formed, with paddles 31' having downset 32', outside the frame portion of the leadframe and then folded under the frame portion before the leadframe is affixed to slug 21 and the frame portion (preferably including the ends of paddles 31, 31') is cut off.

Providing two metallized layers 26, 26' and two interposers 29, 29' gives four areas to which leads can be wirebonded to avoid having to cross leads and to avoid any other potential lead routing problems. For example, one ground plane, one power plane and two signal busses could be provided. Of course, one could provided the two metallized layers 26, 26' but only one of the interposers 29, 29', or vice-versa. Or one could provide more metallized layers or more interposers, depending on the requirements of the particular device. Increasing the number of metallized layers may be easier than increasing the number of interposers, because while an interposer generally runs completely around die 22, it may not be necessary for a metallized layer to run completely around slug 21. Thus, each metallized layer 26, 26' as shown could be broken up into a plurality of metallized areas (not shown).

The spacing of lead fingers 28 from the surface of slug 21 according to the present invention allows the provision of at least one metallized layer 26. This reduces the size of the integrated circuit package needed for a particular device, all other parameters being equal, because the metallized layer can serve the function of a second interposer without increasing the package size to accommodate a second interposer. Similarly, although in the embodiment of FIGS. 5 and 6 the package has to be big enough to accommodate two interposers, no additional space is needed for the two metallized layers, resulting in a savings in size over a package large enough to accommodate four interposers. Alternatively, a larger die could be accommodated in the same package size with the same connections.

The replacement of adhesive tape with a bonded ceramic layer, or a nonconductive adhesive layer, extending to the edge of the slug increases the resistance of the package to moisture infiltration. Similarly, proper selection of the materials for the metallized layer or layers can improve the adhesion of the mold compound to the metallized layer, further resisting delamination.

Thus it is seen that an integrated circuit package having increased flexibility to maintain compatible assignments among members of a family of integrated circuit devices, in which as much of the package area as possible is occupied by the integrated circuit die, in which capacitance and inductance among the various power and signal paths are minimized, in which the lead fingers are better insulated from the heat sinking mass, and which is resistant to moisture-induced delamination, has been provided. One skilled in the art will appreciate that the present invention can be practiced by other than the described embodiments, which are presented for purposes of illustration and not of limitation, and the present invention is limited only by the claims which follow.

What is claimed is:

1. An integrated circuit package, comprising:
   a heat sinking mass having a plurality of edges and a first surface, at least a portion of said first surface being nonconductive;
   an integrated circuit die mounted on said first surface, said integrated circuit die having a plurality of terminal pads;
   a plurality of lead fingers positioned substantially in a leadframe plane spaced away from said first surface;
   a first conductive layer bonded to at least a first portion of said nonconductive portion of said first surface; and
   a plurality of lead wires, at least one of said lead wires being connected between one of said terminal pads and one of said lead fingers, at least one of said lead wires being connected between one of said terminal pads and said first conductive layer, and at least one of said lead wires being connected between said first conductive layer and one of said lead fingers.

2. The integrated circuit package of claim 1 further comprising a conductive interposer circumscribing said integrated circuit die and bonded to said first surface, at least one of said lead wires being connected between one of said terminal pads and said conductive interposer, and at least one of said lead wires being connected between said conductive interposer and one of said lead fingers.

3. The integrated circuit package of claim 2 wherein:
   at least a portion of said first surface is conductive; and
   said conductive interposer is bonded to said conductive portion of said first surface.

4. The integrated circuit package of claim 3 further comprising a nonconductive bonding layer between said conductive interposer and said conductive portion of said first surface.

5. The integrated circuit package of claim 4 wherein said nonconductive bonding layer is a nonconductive adhesive.

6. The integrated circuit package of claim 2 wherein said conductive interposer comprises at least one lead paddle having a first portion extending therefrom in a direction away from said first surface, and a second portion extending from said first portion substantially in said leadframe plane.

7. The integrated circuit package of claim 2 further comprising a second conductive interposer circumscribing first conductive interposer and isolated electrically therefrom, said second conductive interposer being bonded to said first surface, at least one of said lead wires being connected between said second conductive interposer and one of (a) one of said terminal pads, and (b) one of said lead fingers, and at least a second one of said lead wires being connected between said second conductive interposer and another one of (1) one of said terminal pads, and (2) one of said lead fingers.

8. The integrated circuit package of claim 7 wherein:
   at least a portion of said first surface is conductive; and
   said second conductive interposer is bonded to said conductive portion of said first surface.

9. The integrated circuit package of claim 8 further comprising a nonconductive bonding layer between said second conductive interposer and said conductive portion of said first surface.

10. The integrated circuit package of claim 9 wherein said nonconductive bonding layer is a nonconductive adhesive.

11. The integrated circuit package of claim 1 wherein said heat sinking mass is a mass of conductive metal.

12. The integrated circuit package of claim 11 wherein said conductive metal is copper.

13. The integrated circuit package of claim 11 wherein said nonconductive portion of said first surface comprises a ceramic layer bonded to a portion of said first surface.

14. The integrated circuit package of claim 13 wherein said conductive layer comprises a metallic layer bonded to said ceramic layer.

15. The integrated circuit package of claim 14 wherein said metallic layer is a metallization film deposited on said ceramic layer.

16. The integrated circuit package of claim 14 wherein said metallic layer is a sheet of conductive metal adhered to said ceramic layer.

17. The integrated circuit package of claim 16 wherein said sheet of conductive metal comprises copper.

18. The integrated circuit package of claim 17 wherein said sheet of conductive metal comprises copper and is plated with a second metal for enhancing wire bondability.

19. The integrated circuit package of claim 18 wherein said second metal is gold.

20. The integrated circuit package of claim 18 wherein said second metal is silver.

21. The integrated circuit package of claim 11 wherein:
said conductive layer is a sheet of conductive metal; and
said nonconductive portion of said first surface is a nonconductive adhesive bonding said sheet of conductive metal to said first surface.

22. The integrated circuit package of claim 21 wherein said sheet of conductive metal comprises copper.

23. The integrated circuit package of claim 22 wherein said sheet of conductive metal comprises copper and is plated with a second metal for enhancing wire bondability.

24. The integrated circuit package of claim 23 wherein said second metal is gold.

25. The integrated circuit package of claim 23 wherein said second metal is silver.

26. The integrated circuit package of claim 1 further comprising a second conductive layer bonded to a second portion of said nonconductive portion of said first surface, wherein at least one of said lead wires is connected between one of said terminal pads and said second conductive layer and one of said lead wires is connected between said second conductive layer and one of said lead fingers.

27. The integrated circuit package of claim 26 wherein said heat sinking mass is a mass of conductive metal.

28. The integrated circuit package of claim 27 wherein said conductive metal is copper.

29. The integrated circuit package of claim 27 wherein said nonconductive portion of said first surface comprises a ceramic layer bonded to a portion of said first surface.

30. The integrated circuit package of claim 29 wherein said second conductive layer comprises a metallic layer bonded to said ceramic layer.

31. The integrated circuit package of claim 30 wherein said metallic layer is a metallization film deposited on said ceramic layer.

32. The integrated circuit package of claim 30 wherein said metallic layer is a sheet of conductive metal adhered to said ceramic layer.

33. The integrated circuit package of claim 32 wherein said sheet of conductive metal comprises copper.

34. The integrated circuit package of claim 33 wherein said sheet of conductive metal comprises copper and is plated with a second metal for enhancing wire bondability.

35. The integrated circuit package of claim 34 wherein said second metal is gold.

36. The integrated circuit package of claim 34 wherein said second metal is silver.

37. The integrated circuit package of claim 27 wherein:
said second conductive layer is a sheet of conductive metal; and
said nonconductive portion of said first surface is a nonconductive adhesive bonding said sheet of conductive metal to said first surface.

38. The integrated circuit package of claim 37 wherein said sheet of conductive metal comprises copper.

39. The integrated circuit package of claim 38 wherein said sheet of conductive metal comprises copper and is plated with a second metal for enhancing wire bondability.

40. The integrated circuit package of claim 39 wherein said second metal is gold.

41. The integrated circuit package of claim 39 wherein said second metal is silver.

42. The integrated circuit package of claim 1 wherein said nonconductive portion of said first surface comprises a ceramic layer bonded to a portion of said first surface.

43. The integrated circuit package of claim 42 wherein said conductive layer comprises a metallic layer bonded to said ceramic layer.

44. The integrated circuit package of claim 43 wherein said metallic layer is a metallization film deposited on said ceramic layer.

45. The integrated circuit package of claim 43 wherein said metallic layer is a sheet of conductive metal adhered to said ceramic layer.

46. The integrated circuit package of claim 45 wherein said sheet of conductive metal comprises copper.

47. The integrated circuit package of claim 46 wherein said sheet of conductive metal comprises copper and is plated with a second metal for enhancing wire bondability.

48. The integrated circuit package of claim 47 wherein said second metal is gold.

49. The integrated circuit package of claim 47 wherein said second metal is silver.

50. The integrated circuit package of claim 1 wherein:
said first conductive layer is a sheet of conductive metal; and
said nonconductive portion of said first surface is a nonconductive adhesive bonding said sheet of conductive metal to said first surface.

51. The integrated circuit package of claim 50 wherein said sheet of conductive metal comprises copper.

52. The integrated circuit package of claim 51 wherein said sheet of conductive metal comprises copper and is plated with a second metal for enhancing wire bondability.

53. The integrated circuit package of claim 52 wherein said second metal is gold.

54. The integrated circuit package of claim 52 wherein said second metal is silver.

55. The integrated circuit package of claim 1 further comprising a mold compound surrounding said heat sinking mass, said integrated circuit die, said lead wires, and at least a portion of each lead finger in said plurality of lead fingers, said mold compound and said conductive layer forming an adhesion bond that is substantially impermeable to water.

56. The integrated circuit package of claim 55 wherein said first conductive layer extends to said edges of said first surface, whereby said substantially water-impermeable adhesion bond substantially prevents moisture-induced delamination of said mold compound from said heat sinking mass.

57. An integrated circuit package, comprising:
a heat sinking mass having a surface;
an integrated circuit die mounted on said surface, said integrated circuit die having a plurality of terminal pads;
a plurality of lead fingers positioned substantially in a leadframe plane spaced away from said first surface;
a plurality of lead wires, said lead wires being connected between respective ones of said terminal pads and respective ones of said lead fingers; and
a mold compound encapsulating said mass, said die, said lead fingers and said lead wires, said mold compound being present between said lead fingers and said mass, said lead fingers being spaced apart from said mass solely by said mold compound.

* * * * *